United States Patent
Otake et al.

(10) Patent No.: US 11,486,906 B2
(45) Date of Patent: Nov. 1, 2022

(54) VOLTAGE MEASURING DEVICE AND GAS-INSULATED SWITCHING APPARATUS

(71) Applicant: Mitsubishi Electric Corporation, Tokyo (JP)

(72) Inventors: Yasutomo Otake, Tokyo (JP); Takahiro Umemoto, Tokyo (JP); Yasuhito Hashiba, Tokyo (JP); Hiroyuki Kawano, Tokyo (JP); Daigo Matsumoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 9 days.

(21) Appl. No.: 17/296,266

(22) PCT Filed: Jan. 24, 2019

(86) PCT No.: PCT/JP2019/002233
§ 371 (c)(1),
(2) Date: May 24, 2021

(87) PCT Pub. No.: WO2020/152820
PCT Pub. Date: Jul. 30, 2020

(65) Prior Publication Data
US 2022/0026470 A1 Jan. 27, 2022

(51) Int. Cl.
*G01R 15/24* (2006.01)
*G01R 19/00* (2006.01)

(52) U.S. Cl.
CPC ......... *G01R 15/242* (2013.01); *G01R 15/247* (2013.01); *G01R 19/00* (2013.01)

(58) Field of Classification Search
CPC .............. G01R 15/242; G01R 15/241; G01R 33/0322; G01R 19/00; G01R 19/32;
(Continued)

(56) References Cited

U.S. PATENT DOCUMENTS

| | | | | |
|---|---|---|---|---|
| 6,016,053 A | * | 1/2000 | Yakymyshyn | G01R 15/242 324/96 |
| 6,124,706 A | * | 9/2000 | Woods | G01R 1/071 324/96 |
| 6,307,666 B1 | * | 10/2001 | Davidson | G02F 1/0322 359/251 |

FOREIGN PATENT DOCUMENTS

| | | |
|---|---|---|
| JP | H0593743 A | 4/1993 |
| JP | H10221380 A | 8/1998 |
| JP | 2015011019 A | 1/2015 |

OTHER PUBLICATIONS

International Search Report (PCT/ISA/210) and Written Opinion (PCT/ISA/237) dated Apr. 2, 2019, by the Japan Patent Office as the International Searching Authority for International Application No. PCT/JP2019/002233.

* cited by examiner

*Primary Examiner* — Vinh P Nguyen
(74) *Attorney, Agent, or Firm* — Buchanan Ingersoll & Rooney PC

(57) ABSTRACT

The voltage measuring device includes: a light source; a polarizer polarizing light emitted from the light source; a grounded conductor provided apart from a high-voltage conductor; a crystal end face electrode being out of contact with the grounded conductor and the high-voltage conductor; a Pockels cell transmitting light from the polarizer; an analyzer transmitting light reflected by the Pockels cell; a photodetector detecting light emitted from the analyzer; an intra-crystal electric field measurement unit converting voltage output by the photodetector into intra-crystal electric field; a bias electrode being out of contact with the crystal end face electrode; a bias supply; a bias supply control unit controlling the bias supply to keep internal electric field of the Pockels cell at zero; and a measurement voltage calculation unit obtaining voltage of the high-voltage conductor (Continued)

based on results output by the intra-crystal electric field measurement unit and the bias supply control unit.

11 Claims, 6 Drawing Sheets

(58) Field of Classification Search
CPC .. G01R 31/308; G01R 1/071; G01R 29/0885; G01R 15/245; G01R 33/0325; G02F 1/095; G02F 2203/12; G02F 1/0316; G02F 1/3136; G02F 2201/12; G02F 1/0147; G02F 1/377; G02F 1/395; G02B 6/42; G02B 5/3066; G02B 27/0172; G02B 30/25; G02B 27/286; G06F 3/0304
See application file for complete search history.

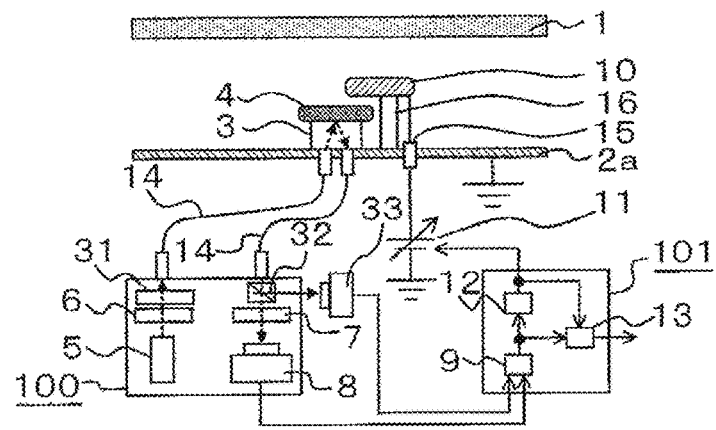

VOLTAGE MEASURING DEVICE AND GAS-INSULATED SWITCHING APPARATUS

FIELD

The present invention relates to a voltage measuring device and a gas-insulated switching apparatus that use the electro-optical effect.

BACKGROUND

With regard to long-distance power transmission, high-voltage direct current (hereinafter referred to as HVDC) power transmission, which is a DC power transmission technique, is attracting worldwide attention from the viewpoint of power transmission efficiency and cost, and technological development is underway in each country. It is necessary to constantly monitor DC voltage for control, protection, and measurement of a power system at an AC/DC converter station and a frequency converter station. The AC/DC converter station is for linking a DC transmission system to a conventional AC transmission system. The frequency converter station uses DC power transmission for connection between AC transmission systems with different frequencies so as to link the AC transmission systems.

The DC voltage to be monitored in the transmission systems, the AC/DC converter station, and the frequency converter station is generally a high voltage of several hundred kV, so that it is difficult to directly measure the DC voltage. Therefore, a method using the linear electro-optical effect called the Pockels effect has been proposed as a method for measuring voltage.

The linear electro-optical effect is a phenomenon in which when an electric field is applied to an electro-optical crystal, a refractive index changes linearly in proportion to the intensity of the electric field, causing birefringence. Birefringence refers to the following phenomenon. When an electric field is applied to an electro-optical crystal, a refractive index only in a specific direction changes and the electro-optical crystal thus has a refractive index anisotropy. In the case where light passes through the inside of such an electro-optical, an optical phase difference is caused by a difference in transmission rate between two orthogonal components in the electro-optical crystal, resulting in a change in polarization state. The optical phase difference is hereinafter referred to as polarization phase difference. In the example of birefringence, when linearly polarized light with a predetermined angle enters the electro-optical crystal to which the electric field has been applied, elliptically polarized light is emitted. In the Pockels effect, which is the linear electro-optical effect, the polarization phase difference is proportional to the electric field applied to the electro-optical crystal. Thus, it is possible to obtain the electric field applied to the electro-optical crystal, that is, the potential difference across the electro-optical crystal by obtaining the polarization phase difference by measurement.

Therefore, the following method has been conventionally used. The voltage of a DC system is temporarily lowered to a voltage that can be easily handled, by use of a voltage divider including a plurality of resistors. Then, the voltage is applied across an electro-optical crystal having the Pockels effect for measurement (see, for example, Patent Literature 1). In addition, there has been a method of measuring the voltage of a high-voltage conductor of a DC system in a non-contact manner by using an electric field sensor utilizing the Pockels effect (see, for example, Patent Literature 2).

CITATION LIST

Patent Literature

Patent Literature 1: Japanese Patent Application Laid-open No. 2015-11019
Patent Literature 2: Japanese Patent Application Laid-open No. 5-93743

SUMMARY

Technical Problem

However, such a conventional method of measuring a DC system voltage by using a voltage divider including a plurality of resistors has a problem in that it is necessary to soak the plurality of resistors in insulating oil, leading to an increase in the size of a voltage measuring device. Furthermore, application of a DC voltage to an electro-optical crystal having the Pockels effect causes a fluctuation phenomenon in which a voltage across the electro-optical crystal gradually decreases due to charge behavior through the inside of the electro-optical crystal. As a result, a device that measures voltage in a non-contact manner by using an electric field sensor that uses an electro-optical crystal having the Pockels effect has a problem in that the accuracy of a DC voltage to be measured decreases due to the influence of the fluctuation phenomenon.

The present invention has been made to solve the above-described problems, and an object of the present invention is to provide a voltage measuring device capable of reducing a decrease in the accuracy of measuring a DC voltage to be measured due to the influence of the fluctuation phenomenon, without an increase in size.

Solution to Problem

A voltage measuring device according to the present invention includes: a light source; a polarizer to polarize light emitted from the light source; a grounded conductor provided in such a way as to be separated from a high-voltage conductor, the grounded conductor being grounded; a crystal end face electrode having a floating potential, the crystal end face electrode being out of contact with the grounded conductor and the high-voltage conductor; a Pockels cell to transmit the light emitted from the polarizer, the Pockels cell being provided between the crystal end face electrode and the grounded conductor; an analyzer to transmit the light reflected by the Pockels cell; a photodetector to detect the light emitted from the analyzer; an intra-crystal electric field measurement unit to convert a voltage output by the photodetector into an intra-crystal electric field and output the intra-crystal electric field; a bias electrode provided between the high-voltage conductor and the crystal end face electrode in such a way as to be out of contact with the crystal end face electrode; a bias supply connected to the bias electrode; a bias supply control unit to control the bias supply so as to keep an internal electric field of the Pockels cell at zero, the bias supply control unit being connected to the intra-crystal electric field measurement unit; and a measurement voltage calculation unit to obtain a voltage of the high-voltage conductor based on results output by the intra-crystal electric field measurement unit and the bias supply control unit.

Advantageous Effects of Invention

The voltage measuring device according to the present invention uses an electro-optical crystal. As a result, it is possible to reduce the size of the voltage measuring device and reduce a decrease in the accuracy of measuring a DC voltage to be measured due to the influence of a fluctuation phenomenon.

BRIEF DESCRIPTION OF DRAWINGS

FIG. 8 is an example of a configuration diagram for describing a voltage measuring device according to a third embodiment.

FIG. 9 is an example of a configuration diagram for describing a voltage measuring device according to a fourth embodiment.

FIG. 10 is an example of a configuration diagram for describing a voltage measuring device according to a fifth embodiment.

DESCRIPTION OF EMBODIMENTS

First Embodiment

Figure 1:
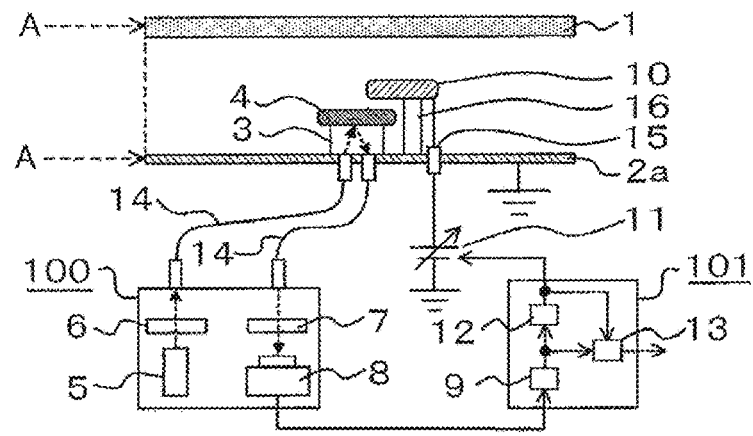
FIG. 1 is an example of a configuration diagram for describing a voltage measuring device according to a first embodiment.

A voltage measuring device according to the present embodiment will be described. FIG. 1 is a configuration diagram for describing the configuration of the voltage measuring device according to the present embodiment. Dotted arrows indicate the flow of laser light. In addition, solid arrows indicate the flow of signals.

As illustrated in FIG. 1, the voltage measuring device according to present embodiment measures a DC voltage applied to a high-voltage conductor 1. The voltage measuring device according to the present embodiment includes a grounded conductor 2a fixed at ground potential, a Pockels cell 3, a crystal end face electrode 4, a bias electrode 10, a bias supply 11, optical fibers 14, a bushing 15, an insulating support 16, an input unit 100, and an output unit 101.

The Pockels cell 3 including an electro-optical crystal having the Pockels effect is disposed between the high-voltage conductor 1 and the grounded conductor 2a such that the Pockels cell 3 is out of contact with the high-voltage conductor 1 and in contact with the grounded conductor 2a. The crystal end face electrode 4 is provided on the upper surface of the Pockels cell 3. Furthermore, the input unit 100 includes a light source 5, a polarizer 6, an analyzer 7, and a photodetector 8. The output unit 101 includes an intra-crystal electric field measurement unit 9, a bias supply control unit 12, and a measurement voltage calculation unit 13. Note that description will be given below on the assumption that the light source 5 is a laser light source. Furthermore, the optical fibers 14 enable the polarization state of laser light to be maintained.

Laser light emitted from the light source 5 and having passed through the polarizer 6 enters the Pockels cell 3 from the bottom thereof through one of the optical fibers 14. The laser light having entered the Pockels cell 3 through the one of the optical fibers 14 is reflected by the upper end face of the Pockels cell 3, passes through the analyzer 7 through the other optical fiber 14, and enters the photodetector 8. The photodetector 8 outputs detected intensity of the laser light to the intra-crystal electric field measurement unit 9.

The intra-crystal electric field measurement unit 9 obtains an electric field in the electro-optical crystal of the Pockels cell 3 on the basis of the intensity of the laser light, and outputs a value of the measured electric field to the bias supply control unit 12 and the measurement voltage calculation unit 13.

The bias electrode 10 is supported and fixed by the insulating support 16 such that the bias electrode 10 is out of contact with the crystal end face electrode 4.

The bias supply 11 is connected to the bias electrode 10 through the bushing 15 intended for electrical insulation from the grounded conductor 2a.

The bias supply control unit 12 outputs a setting signal so as to set a bias voltage to be output from the bias supply 11 according to the electric field value input from the intra-crystal electric field measurement unit 9. The setting signal output by the bias supply control unit 12 is input to the bias supply 11, so that the bias voltage to be output is controlled by the bias supply control unit 12.

Furthermore, the measurement voltage calculation unit 13 is connected to the intra-crystal electric field measurement unit 9 and the bias supply 11, and obtains a DC voltage applied to the high-voltage conductor 1 by performing calculation based on the value of the electric field measured by the intra-crystal electric field measurement unit 9 and the setting signal output from the bias supply control unit 12.

Figure 2:
FIG. 2 is a cross-sectional view of part of the configuration diagram for describing the voltage measuring device according to the first embodiment as viewed in the direction of arrows A.

FIG. 2 is a cross-sectional view of the high-voltage conductor 1 and the grounded conductor 2a as viewed in the direction of dashed arrows A in FIG. 1. As illustrated in FIG. 2, the grounded conductor 2a has a flat-plate shape, and is provided away from the high-voltage conductor 1 in such a way as to face the high-voltage conductor 1.

In the present embodiment, the high-voltage conductor 1 serves as a charging unit that is connected to a DC power transmission line and boosted so as to reduce Joule loss for DC power transmission, and a DC voltage of up to several hundred kV is applied to the high-voltage conductor 1. Examples of the high-voltage conductor 1 include conductors around electric power devices in substations, AC/DC converter stations, and frequency converter stations.

The grounded conductor 2a is installed in such a way as to face the high-voltage conductor 1. The potential of the grounded conductor 2a is fixed at earth potential, that is, zero potential through a grounding wire and a grounding electrode embedded in the ground. The impedances of the grounding wire and the grounding electrode need to be sufficiently low, and it is desirable to secure class A grounding.

The electro-optical crystal to be used for the Pockels cell 3 is a crystal having the linear electro-optical effect, that is, the so-called Pockels effect. Examples of the electro-optical crystal include $LiNbO_3$, $LiTaO_3$, $Bi_{12}SiO_{12}$, $BiGe_3O_{12}$, and crystal.

The Pockels cell 3 is installed for measuring the potential difference between the grounded conductor 2a and the crystal end face electrode 4. The electro-optical crystal included in the Pockels cell 3 has a higher permittivity and a lower resistivity than a surrounding medium such as air or insulating gas. Therefore, if there are gaps between the electro-optical crystal of the Pockels cell 3 and the grounded conductor 2a and between the electro-optical crystal and the crystal end face electrode 4, a voltage across the Pockels cell 3 will significantly change. Such a change in the voltage across the Pockels cell 3 will cause an error in measurement of the potential of the high-voltage conductor 1.

Figure 3:
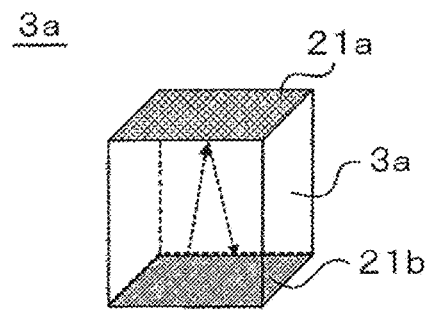
FIG. 3 is an example of a schematic diagram of a Pockels cell to be used in the voltage measuring device according to the first embodiment.

FIG. 3 is a schematic diagram of the Pockels cell 3 to be used in the voltage measuring device of the present embodiment. Dotted arrows indicate the flow of laser light. As illustrated in FIG. 3, a conductive layer 21a is provided on the contact face between an electro-optical crystal 3a and the crystal end face electrode 4. In addition, a conductive layer 21b is provided on the contact face between the electro-optical crystal 3a and the grounded conductor 2a. This leads to a reduction in errors in measurement of the potential of the high-voltage conductor 1. The conductive layer 21a and the conductive layer 21b are formed by vapor deposition of a conductive material on both end faces of the electro-optical crystal 3a.

The conductive layer 21a and the conductive layer 21b prevent formation of a gap between the electro-optical crystal 3a and the crystal end face electrode 4 and a gap between the electro-optical crystal 3a and the grounded conductor 2a. As a result, it is possible to reduce errors in measurement of the potential of the high-voltage conductor 1.

Laser light is passed through the Pockels cell 3 for measuring a polarization phase difference caused by a change in refractive index in the electro-optical crystal 3a due to the electric field. In the example of FIG. 1, an incident-side opening through which light passes is provided in the grounded conductor 2a in contact with the conductive layer 21b provided on the Pockels cell 3. Thus, laser light enters from the incident-side opening. In this case, the incident-side opening is provided such that laser light passes in the same direction as the direction of an electric field formed between the high-voltage conductor 1 and the grounded conductor 2a. Then, the laser light is reflected by the surface of the conductive layer 21a provided on the upper surface of the Pockels cell 3 in contact with the crystal end face electrode 4. An exit-side opening through which light passes is also provided in the grounded conductor 2a in contact with the conductive layer 21b provided on the Pockels cell 3. Thus, the laser light reflected by the surface of the conductive layer 21a and having returned through the inside of the Pockels cell 3 is emitted from the exit-side opening.

Therefore, the upper surface of the Pockels cell 3 needs to include the conductive layer 21a having optical reflective properties and electrically connectable to the crystal end face electrode 4 in FIGS. 1 and 3.

Furthermore, the lower surface of the Pockels cell 3 needs to include the conductive layer 21b having optical transmission properties and electrically connectable to the grounded conductor 2a.

A conductive material including material such as gold or aluminum is used for the conductive layer 21a that needs to have optical reflective properties.

Material such as indium tin oxide (ITO) having optical transmission properties is used for the conductive layer 21b that needs to have optical transmission properties so as to secure a laser light path.

The crystal end face electrode 4 is installed in contact with the conductive layer 21a provided on the Pockels cell 3. Since the crystal end face electrode 4 is installed under a high electric field, it is desirable for the crystal end face electrode 4 to have, for example, round-chamfered edges so as to have a shape that enables electric field enhancement to be avoided.

In order for the crystal end face electrode 4 to have a floating potential, the crystal end face electrode 4 is installed such that the crystal end face electrode 4 is out of contact with the high-voltage conductor 1, the grounded conductor 2a, and the bias electrode 10.

Figure 4:
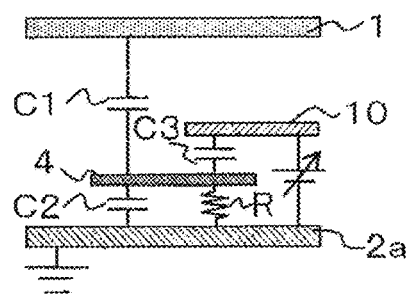
FIG. 4 is an example of an electrical equivalent circuit for describing the voltage measuring device according to the first embodiment.

FIG. 4 is an electrical equivalent circuit diagram of a voltage measurement system for measuring the DC voltage applied to the high-voltage conductor 1 in the voltage measuring device according to the first embodiment. A potential Vf of the crystal end face electrode 4 is indicated by formula (1). The potential Vf of the crystal end face electrode 4 is determined by a potential Vapp of the high-voltage conductor 1, the zero potential of the grounded conductor 2a, and a potential Vb of the bias electrode 10. Here, $C_1$ denotes the capacitance between the crystal end face electrode 4 and the high-voltage conductor 1, $C_2$ denotes the capacitance between the crystal end face electrode 4 and the grounded conductor 2a, $C_3$ denotes the capacitance between the crystal end face electrode 4 and the bias electrode 10, R denotes the electric resistance of the Pockels cell 3, and Q denotes the charge amount of the crystal end face electrode 4.

[Formula 1]

$$V_f = \frac{C_1 V_{app} + C_3 V_b + Q}{C_1 + C_2 + C_3} \qquad \text{Formula (1)}$$

The electric resistance R of the electro-optical crystal 3a included in the Pockels cell 3 is finite. Therefore, when the potential Vf of the crystal end face electrode 4 is not zero, the charge amount Q of the crystal end face electrode 4 changes due to charge transfer through the electric resistance R, and the potential Vf of the crystal end face electrode 4 changes such that the crystal end face electrode 4 and the grounded conductor 2a are equal in potential. The decay time constant of this change is represented by the product of the permittivity and resistivity of the electro-optical crystal 3a.

It is desirable to use a light source with good coherence and directivity as the light source 5. Thus, a laser is often used as the light source 5. Specific examples of the laser to be used include a semiconductor laser, a solid-state laser, and a gas laser.

Laser light emitted by the light source 5 is linearly polarized as a result of passing through the polarizer 6, and enters the Pockels cell 3 through the optical fiber 14 that has a collimator at both ends and maintains polarization. The laser light having passed through the Pockels cell 3 is reflected by the surface of the conductive layer 21a after a polarization phase difference is generated according to the electric field in the electro-optical crystal 3a. The reflected laser light again passes through the conductive layer 21b after a polarization phase difference is generated according to the electric field in the electro-optical crystal 3a, passes through the analyzer 7 via the optical fiber 14, and enters the photodetector 8. The photodetector 8 detects light intensity as an electric signal by optical-electrical conversion.

It is difficult to directly measure the polarization phase difference generated in the laser light passing through the Pockels cell 3. Therefore, light is passed through the polarizer 6 and the analyzer 7 to convert the polarization phase difference into light intensity for measurement. For example, when the optical axes of the polarizer 6 and the analyzer 7 are arranged orthogonal to each other, the relationship between a light intensity Iin of light entering the Pockels cell 3 and a light intensity Iout of light entering the photodetector 8 is represented by formula (2). Here, a polarization phase difference θ denotes a polarization phase difference caused by the electro-optical effect due to laser light passing through the Pockels cell 3 once. Therefore, since the laser light is reflected as indicated by the dotted arrow in FIG. 1, a polarization phase difference 2θ corresponding to two passages is generated, which is as indicated on the right hand side of formula (2).

[Formula 2]

$$\frac{I_{out}}{I_{in}} = \sin^2 \theta \qquad \text{Formula (2)}$$

In the present embodiment, the polarizer 6 and the analyzer 7 are arranged such that the optical axes thereof are orthogonal to each other. In the case where the polarizer 6 and the analyzer 7 are arranged in this way, part of laser light emitted from the light source 5 passes through the polarizer 6, the part of the laser light being polarized in a specific direction that is the same as the direction of the optical axis of the polarizer 6. In addition, part of laser light emitted from the Pockels cell 3 passes through the analyzer 7, the part of the laser light being polarized in the same direction as the direction of the optical axis of the analyzer 7. That is, the polarization direction of the laser light having passed through the polarizer 6 and the polarization direction of the laser light having passed through the analyzer 7 are orthogonal to each other. Therefore, the laser light emitted by the light source 5 cannot pass through the analyzer 7 in a state where no electric field is applied to the electro-optical crystal 3a. Thus, light intensity to be detected by the photodetector 8 is zero in principle.

Meanwhile, when an electric field is applied to the electro-optical crystal 3a, a polarization phase difference occurs in incident light according to the principle of the Pockels effect. In that case, the light emitted by the light source 5 passes through the polarizer 6 to be linearly polarized light. After that, the linearly polarized light passes through the Pockels cell 3 to be elliptically polarized light. Therefore, a component corresponding to the optical axis of the analyzer 7 can pass through the analyzer 7, and light intensity to be detected by the photodetector 8 has a non-zero value. This light intensity shows a sine curve according to the electric field in the electro-optical crystal 3a. Furthermore, there is a proportional relationship between the polarization phase difference θ and a potential difference V across the electro-optical crystal 3a, and the coefficient of proportionality largely depends on the type and crystal axis of the electro-optical crystal 3a.

Figure 5:
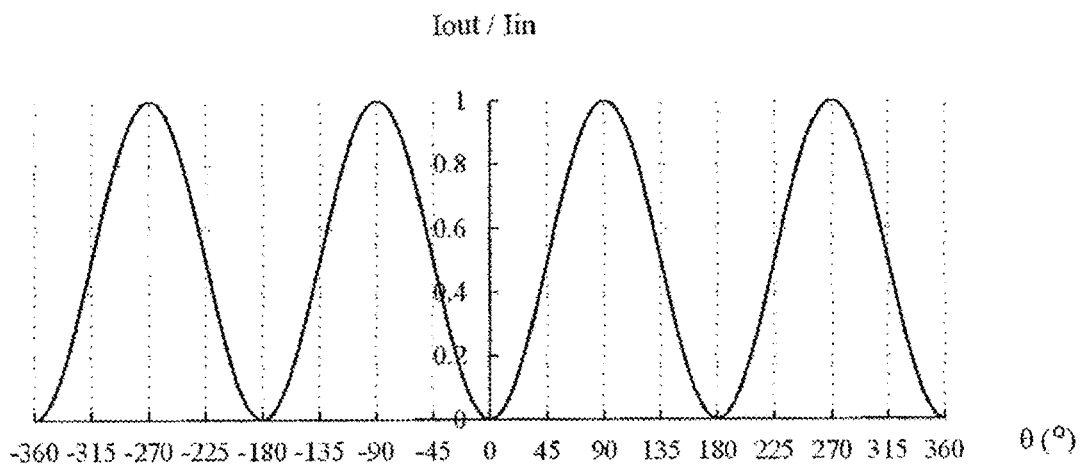
FIG. 5 is an example of a graph of a sine wave of the voltage measuring device according to the first embodiment.

The intra-crystal electric field measurement unit 9 converts an input value of the output voltage of the photodetector 8 into an intra-crystal electric field, and outputs the converted value. FIG. 5 illustrates a sine curve showing the relationship between an intra-crystal electric field acquired in advance during calibration and the output voltage of the photodetector 8. The vertical axis represents the standardized output voltage of the photodetector 8, and the horizontal axis represents the polarization phase difference θ. The output of the intra-crystal electric field measurement unit 9 is input to the bias supply control unit 12.

The bias supply control unit 12 controls the output value of the bias supply 11 according to the internal electric field of the electro-optical crystal 3a. The crystal end face electrode 4 has a floating potential, and it is possible to control the potential of the crystal end face electrode 4 by inducing the potential of the crystal end face electrode 4 according to the potential of the bias electrode 10.

In the present embodiment, the internal electric field of the electro-optical crystal 3a is kept at zero to prevent electric conduction through the electro-optical crystal 3a. The internal electric field of the electro-optical crystal 3a is measured on the basis of the polarization phase difference θ of light propagating in the electro-optical crystal 3a, and is output from the intra-crystal electric field measurement unit 9. Thus, the internal electric field of the electro-optical crystal 3a can be obtained. When the internal electric field of the electro-optical crystal 3a has a non-zero value, the bias supply control unit 12 performs feedback control by controlling the bias supply 11 to change the potential of the crystal end face electrode 4 so that the output of the intra-crystal electric field measurement unit 9 becomes zero.

A feedback cycle needs to be sufficiently shorter than the time constant of charging by electric conduction of the electro-optical crystal 3a. In addition, it is desirable for the feedback cycle to be as short as possible. This is because the feedback cycle determines the response speed of the voltage measuring device. However, it is necessary to increase the sampling frequency of the intra-crystal electric field measurement unit 9 according to the response speed, leading to an increase in cost. Therefore, the feedback cycle is chosen depending on intended use.

The measurement voltage calculation unit 13 receives the output of the intra-crystal electric field measurement unit 9 and the output of the bias supply control unit 12, and confirms that the output of the intra-crystal electric field measurement unit 9 has become zero and the internal electric field of the electro-optical crystal 3a has become zero. After that, the measurement voltage calculation unit 13 calculates the potential Vapp of the high-voltage conductor 1 to be measured. Formula (3) obtained as a result of transformation of formula (1) is shown below. The potential Vapp of the high-voltage conductor 1 is calculated from formula (3). The potential Vf of the crystal end face electrode 4 in formula (3) is generally obtained from the product of the internal electric field and thickness of the electro-optical crystal 3a when the internal electric field of the electro-optical crystal 3a is generated. Note that when the internal electric field of the electro-optical crystal 3a is zero, the potential Vf is also zero.

[Formula 3]

$$V_{app} = \frac{1}{C_1}\{(C_1 + C_2 + C_3)V_f - C_3 V_b - Q\}$$ Formula (3)

The value of the charge amount Q of the crystal end face electrode 4 is generally small. However, as indicated by formula (3), the charge amount Q will cause an error in measurement of the potential of the high-voltage conductor 1. Therefore, the crystal end face electrode 4 is grounded and discharged at the start of measurement so that the charge amount Q becomes zero.

The bias supply control unit 12 controls the bias supply 11. As a result, the internal electric field of the electro-optical crystal 3a can be kept at zero. Accordingly, use of the electro-optical crystal 3a having the Pockels effect prevents an increase in the size of the voltage measuring device. In addition, it is possible to reduce a decrease in the accuracy of measuring a DC voltage to be measured due to the influence of a fluctuation phenomenon by performing feedback control so that the internal electric field of the electro-optical crystal 3a becomes zero.

Second Embodiment

Figure 6:
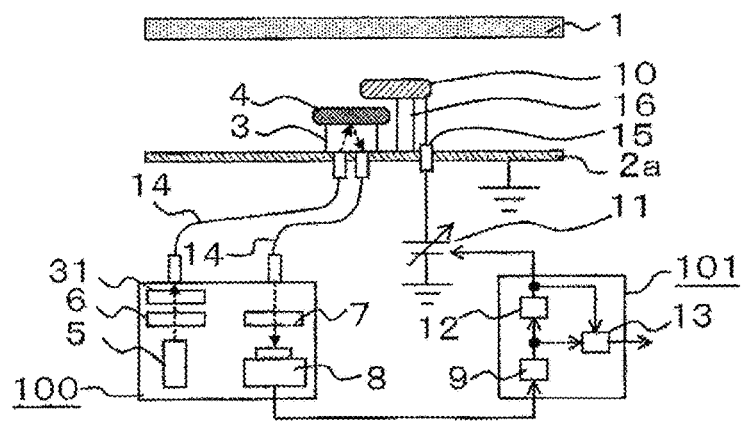
FIG. 6 is an example of a configuration diagram for describing a voltage measuring device according to a second embodiment.

FIG. 6 is a configuration diagram for describing the configuration of a voltage measuring device according to a second embodiment. The second embodiment is different from the first embodiment in that a quarter-wavelength plate 31 is inserted between the polarizer 6 and the Pockels cell 3. Note that description of the point similar to that in the first embodiment will be omitted. FIG. 6 illustrates an example in which the quarter-wavelength plate 31 has been inserted between the polarizer 6 and the Pockels cell 3. However, the quarter-wavelength plate 31 only needs to be inserted at least between the polarizer 6 and the analyzer 7. In the present embodiment, the optical axes of the polarizer 6 and the analyzer 7 are orthogonal to each other, and the FAST axis in the optical axes of the quarter-wavelength plate 31 is set at an angle of ±45 degrees with respect to the optical axis of the polarizer 6.

In the voltage measuring device configured as described above, the relationship between the light intensity Iin of light that enters the Pockels cell 3 and the light intensity Iout of light that enters the photodetector 8 is represented by formula (4). Here, the polarization phase difference θ denotes a polarization phase difference caused by application of an electric field to the electro-optical crystal 3a, as in the first embodiment. After entering the Pockels cell 3, laser light is reflected by the conductive layer 21a to enter the photodetector 8; therefore, sin 2θ is provided based on the flow of laser light indicated by dotted lines in FIG. 6. That is, as in the first embodiment, since the laser light passes through the Pockels cell 3 twice, a polarization phase difference 2θ corresponding to two passages is generated.

[Formula 4]

$$\frac{I_{out}}{I_{in}} = \frac{1 \pm \sin 2\theta}{2}$$ Formula (4)

As a result of application of the quarter-wavelength plate 31, a change in "Iout" (dIout/dθ (θ=0)) increases when the polarization phase difference θ slightly changes from zero. This improves the sensitivity of measurement to be performed when the polarization phase difference θ is in the vicinity of zero.

Figure 7:
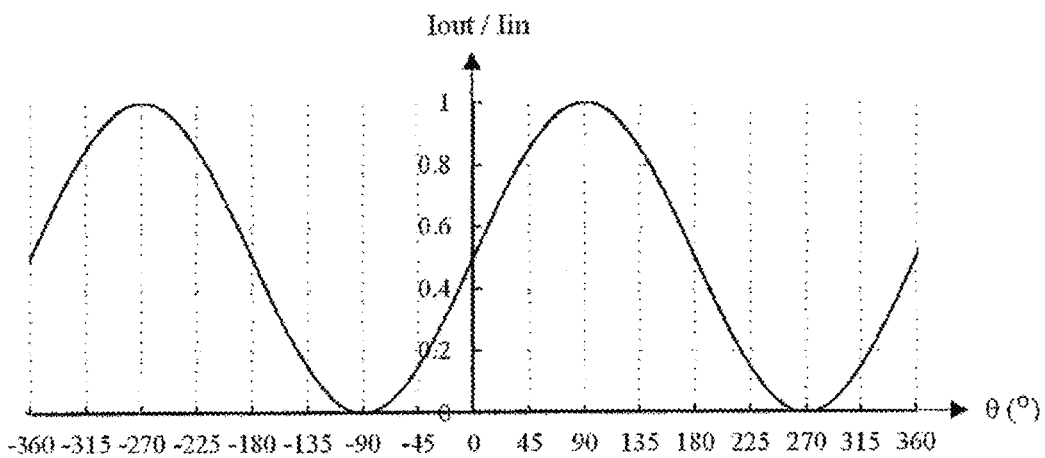
FIG. 7 is an example of a graph of a sine wave of the voltage measuring device according to the second embodiment.

FIG. 7 illustrates a sine curve showing the relationship between an intra-crystal electric field and the output voltage of the photodetector 8 in the present embodiment. FIG. 7 corresponds to a graph in the case where the FAST axis in the optical axes of the quarter-wavelength plate 31 has been set at an angle of +45 degrees with respect to the optical axis of the polarizer 6. The vertical axis represents the relationship between the intra-crystal electric field and the output voltage of the photodetector 8, and the horizontal axis represents the polarization phase difference θ.

As illustrated in FIG. 7, providing the quarter-wavelength plate 31 causes a 45-degree phase shift. Thus, unlike the graph in FIG. 5 of the first embodiment, the graph in FIG. 7 is bilaterally asymmetric. Therefore, the polarity of a DC voltage applied to the high-voltage conductor 1 can also be determined.

Third Embodiment

FIG. 8 is a configuration diagram for describing the configuration of a voltage measuring device according to a third embodiment. The third embodiment is different from the first and second embodiments in that the voltage measuring device according to the third embodiment includes a beam splitter 32 and a reflected-light detector 33. The beam splitter 32 is provided between the Pockels cell 3 and the analyzer 7. The reflected-light detector 33 detects reflected light. Note that description of the points similar to those in the first and second embodiments will be omitted. The intra-crystal electric field measurement unit 9 calculates an electric field applied to the electro-optical crystal 3a from the output voltages of the photodetector 8 and the reflected-light detector 33.

In the configuration of the first embodiment, the intensity of light entering the photodetector 8 increases or decreases due to a change in the intensity of light emitted from the light source 5 and a change in the optical properties of an element on the laser light path caused by, for example, a change in temperature. This leads to an error in reading an electric field in the electro-optical crystal 3a.

The reflected-light detector 33 included in the voltage measuring device according to the present embodiment detects the intensity of laser light before the laser light passes through the analyzer 7. Thus, the reflected-light detector 33 detects only the above-described change in the intensity of light emitted from the light source 5 and the above-described change in the optical properties of the element on the laser light path caused by, for example, a change in temperature, without being affected by the polarization phase difference θ. It is possible to correct the changes to improve measurement accuracy by using the output of the reflected-light detector 33 as "Iin" in formula (2) or formula (4).

Fourth Embodiment

FIG. 9 is a configuration diagram for describing the configuration of a voltage measuring device according to a fourth embodiment.

The fourth embodiment is different from the first to third embodiments in that the voltage measuring device according to the fourth embodiment includes a lock-in amplifier 34, a signal attenuator 35, and an AC power source 36. The lock-in amplifier 34 is connected to the photodetector 8 and the intra-crystal electric field measurement unit 9. Note that description of the points similar to those in the first to third embodiments will be omitted.

The grounded conductor 2a is not directly grounded, but is grounded via the AC power source 36 that generates modulation voltage. That is, the modulation voltage generated by the AC power source 36 is applied to the grounded conductor 2a. In addition, the modulation voltage generated by the AC power source 36 is attenuated via the signal attenuator 35 to become a reference signal of the lock-in amplifier 34.

The lock-in amplifier 34 uses the output of the photodetector 8 as an input signal. In addition, the lock-in amplifier 34 performs phase-synchronous detection of the input signal by using, as a reference signal, an attenuated modulation signal from the signal attenuator 35, and outputs the detected input signal to the intra-crystal electric field measurement unit 9.

The photodetector 8 may be affected by ambient light other than laser light and ambient electromagnetic noise, so that the measurement sensitivity may decrease.

Therefore, the potential of the grounded conductor 2a is oscillated at a predetermined frequency, and components of the same frequency and phase are extracted from the output of the photodetector 8 by the lock-in amplifier 34. As a result, it is possible to reduce the influence of the ambient light other than laser light and the ambient electromagnetic noise described above.

Fifth Embodiment

FIG. 10 is a configuration diagram for describing the configuration of a voltage measuring device according to a fifth embodiment.

The fifth embodiment is different from the first to fourth embodiments in that the voltage measuring device according to the fifth embodiment includes a temperature sensor 37 that measures the temperatures of the Pockels cell 3, the light source 5, the polarizer 6, the analyzer 7, the photodetector 8, and the quarter-wavelength plate 31. Note that description of the points similar to those in the first to fourth embodiments will be omitted. Furthermore, only the single temperature sensor 37 is provided in FIG. 10, but a plurality of the temperature sensors 37 may be provided.

The characteristics of the Pockels cell 3, the light source 5, the polarizer 6, the analyzer 7, and the photodetector 8 change depending on temperature. Therefore, it is possible to reduce the influence thereof by acquiring the temperature dependence in advance and acquiring the temperature of measurement environment by the temperature sensor 37.

Sixth Embodiment

Figure 11:
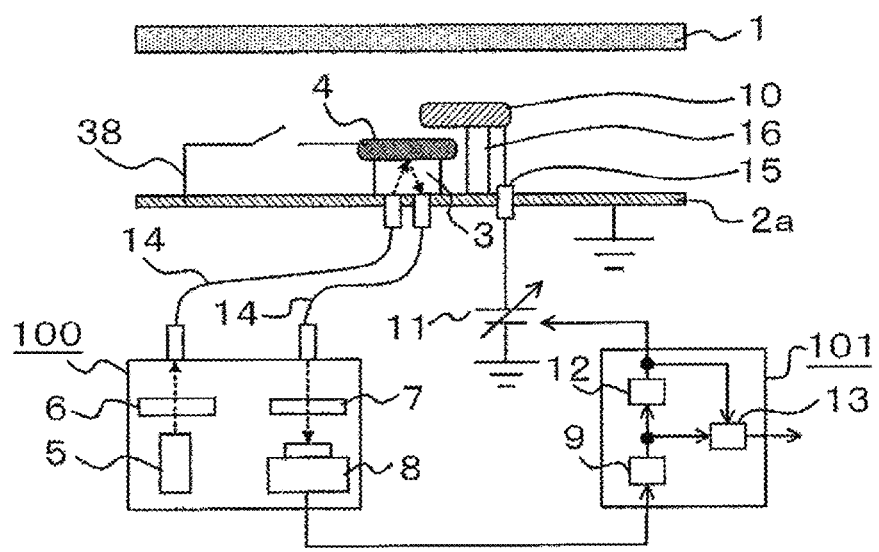
FIG. 11 is an example of a configuration diagram for describing a voltage measuring device according to a sixth embodiment.

FIG. 11 is a structural diagram for describing the structure of a voltage measuring device according to a sixth embodiment. The sixth embodiment is different from the first to fifth embodiments in that the voltage measuring device according to the sixth embodiment includes a discharging unit 38 for discharging the charge of the crystal end face electrode 4. Note that description of the points similar to those in the first to fifth embodiments will be omitted.

As indicated by formula (3), charge of the crystal end face electrode 4 will cause a measurement error. It is conceivable that at the time of measurement, the crystal end face electrode 4 may be charged by electron emission, micro discharge, and space charge emission from a high-electric field portion of a metallic part installed around the crystal end face electrode 4. Therefore, in a structural object around the crystal end face electrode 4, it is necessary to adopt an electric field relaxation structure from which structures that will cause electric field enhancement, such as an electrode corner and a triple point of different materials, have been removed so as to reduce an electric field. However, it is expected that it will be difficult to completely prevent electron emission and the like due to restrictions on the size and cost of a device.

Therefore, as a result of providing the discharging unit 38 as in the present embodiment, the charge of the crystal end face electrode 4 can be periodically discharged, so that it is possible to improve measurement accuracy and reduce the size of a measurement system.

Seventh Embodiment

A gas-insulated switching apparatus refers to a switching apparatus in which a breaker, a disconnector, a grounding switch, a bus bar, a lightning arrester, a voltage transformer, a current transformer, and the like are housed in a grounded metallic airtight container for gas insulation.

Hereinafter, an example of applying a voltage measuring device according to the present embodiment to a gas-insulated switching apparatus in which a bus bar charged with DC voltage is housed will be described as an example of applying the voltage measuring device according to the present embodiment to an apparatus to be used for DC power transmission.

Figure 12:
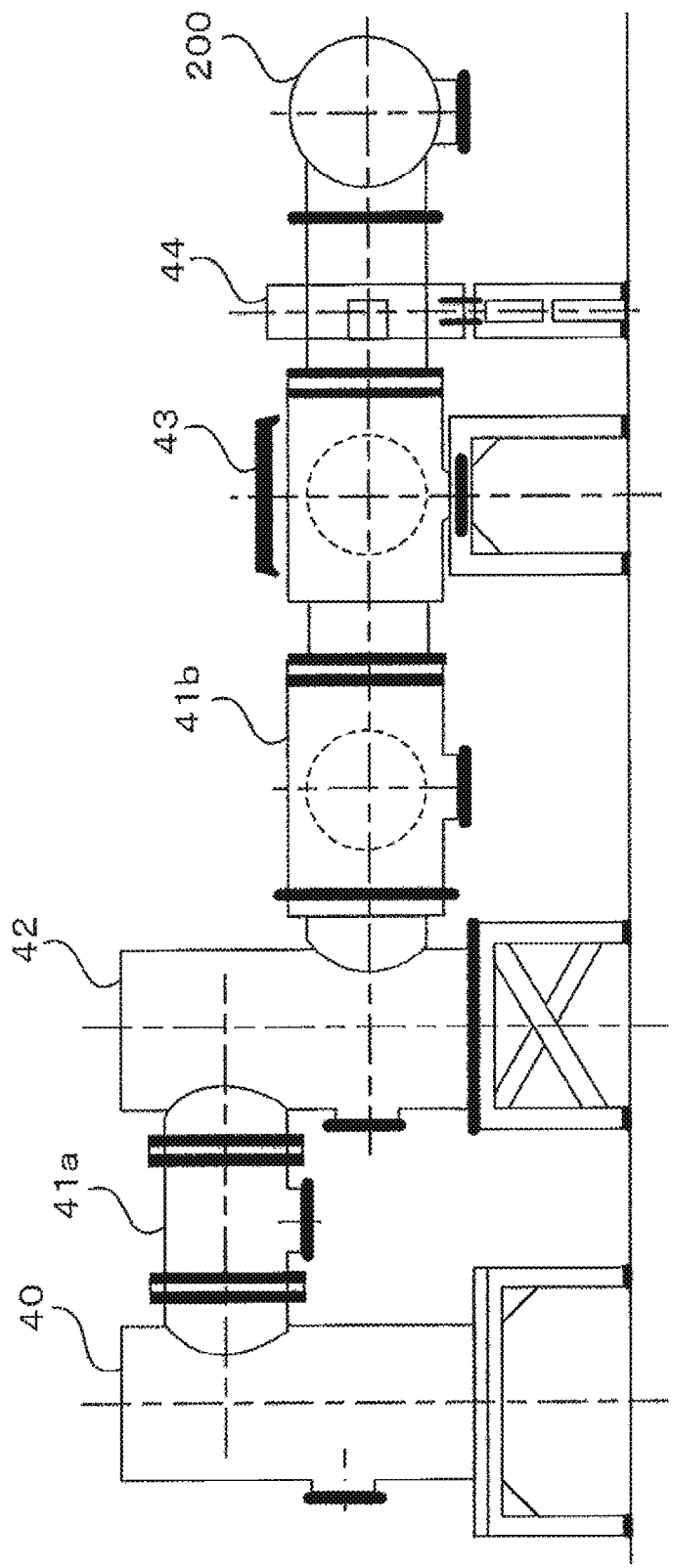
FIG. 12 is an example of an external view of a gas-insulated switching apparatus to which a voltage measuring device according to a seventh embodiment has been applied.
Figure 13:
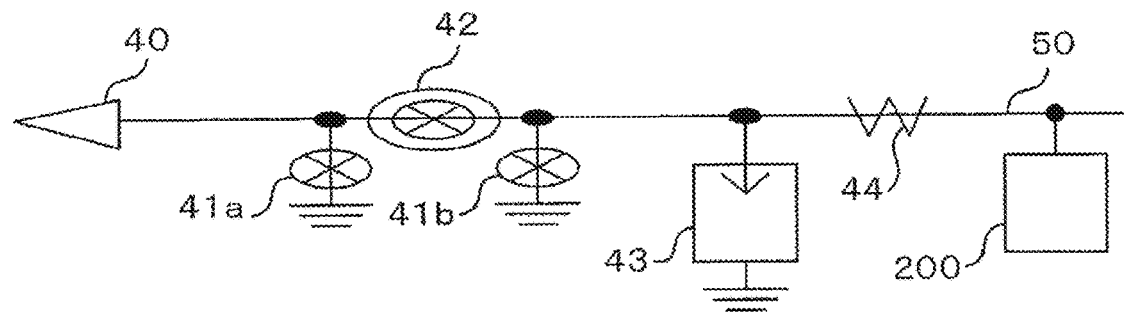
FIG. 13 is an example of a diagram for illustrating a circuit configuration of the gas-insulated switching apparatus to which the voltage measuring device according to the seventh embodiment has been applied.

FIG. 12 is an external view of a gas-insulated switching apparatus to which a voltage measuring device 200 according to the present embodiment has been applied, and FIG. 13 is a diagram for illustrating a circuit configuration of the gas-insulated switching apparatus. A bus bar 50 is housed in a grounded metallic airtight container in the gas-insulated switching apparatus illustrated in FIGS. 12 and 13. The gas-insulated switching apparatus includes a cable head 40, the bus bar 50, a disconnector 42, grounding switches 41a and 41b, a lightning arrester 43, a current transformer 44, and the voltage measuring device 200. The cable head 40 is connected to a DC power transmission line. The DC voltage of the bus bar 50 is to be measured. The grounding switch 41a is provided on one side of the disconnector 42, and the grounding switch 41b is provided on the other side of the disconnector 42. The voltage measuring device 200 measures the DC voltage of the bus bar 50.

Figure 14:
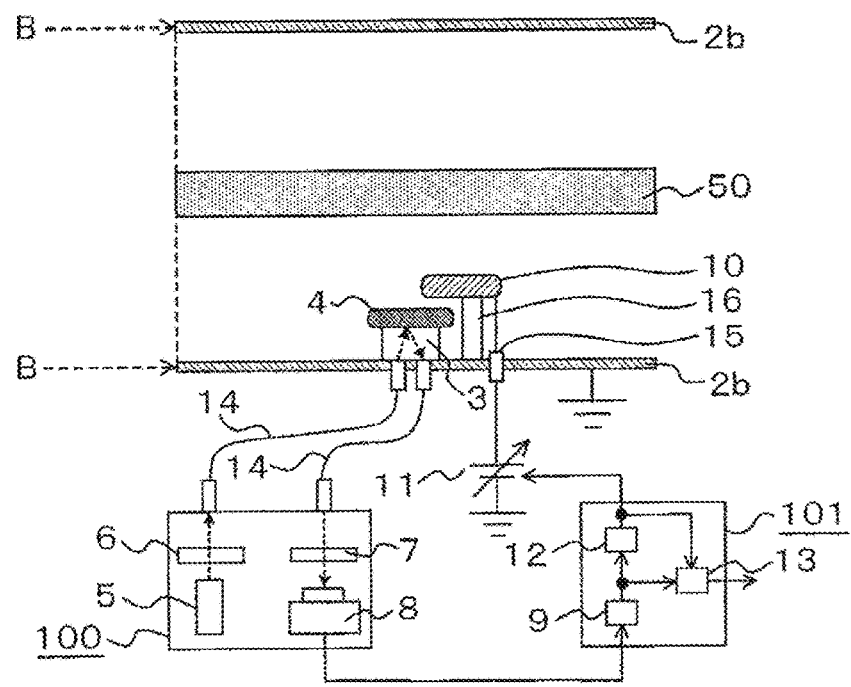
FIG. 14 is an example of a configuration diagram for describing the voltage measuring device according to the seventh embodiment.
Figure 15:
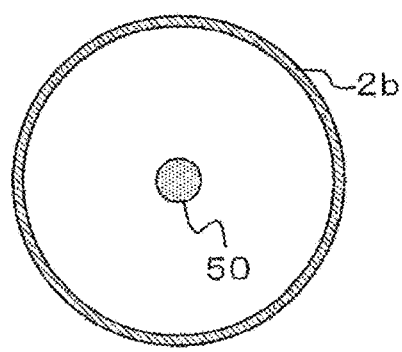
FIG. 15 is a cross-sectional view of part of the configuration diagram for describing the voltage measuring device according to the seventh embodiment as viewed in the direction of arrows B.

FIG. 14 is a configuration diagram for describing the structure of the voltage measuring device 200 according to the present embodiment suitable to be installed in the gas-insulated switching apparatus illustrated in FIGS. 12 and 13. The present embodiment is different from the first to sixth embodiments in that the shape of the grounded conductor has been changed so as to apply the voltage measuring device 200 to the gas-insulated switching apparatus. FIG. 15 is a view of part of the voltage measuring device 200 illustrated in FIG. 14, as viewed in the direction of arrows B in FIG. 14. A grounded conductor 2b in the present embodiment is a metal conductor formed in a cylindrical shape, and is disposed in such a way as to surround the bus bar 50 as a central axis. Note that description of the points similar to those in the first to sixth embodiments will be omitted. The bus bar 50 corresponds to a high-voltage conductor in the present embodiment. The voltage measuring device 200 according to the present embodiment measures a DC voltage with which the bus bar 50 is charged with reference to the potential of the grounded conductor 2b.

In the gas-insulated switching apparatus, an insulation distance for ensuring an insulation distance is ensured in the space between the cylindrical metal conductor corresponding to the grounded conductor 2b and the high-voltage conductor corresponding to the bus bar 50. In addition, the space is hermetically sealed with an insulating gas so as to enhance insulation characteristics. The insulating gas has been pressurized such that the pressure of the insulating gas is equal to or greater than atmospheric pressure. Examples of the insulating gas include dry air, $SF_6$, $CO_2$, and $CF_3I$.

In the voltage measuring device 200 according to the present embodiment, the Pockels cell 3 is installed inside the cylindrical metal conductor corresponding to the grounded conductor 2b. In the present embodiment, the DC voltage with which the bus bar 50 as a high-voltage conductor is charged is measured by use of the method similar to that in the first embodiment.

REFERENCE SIGNS LIST 1 high-voltage conductor
2a, 2b grounded conductor
3 Pockels cell
3a electro-optical crystal
4 crystal end face electrode
5 light source
6 polarizer
7 analyzer
8 photodetector
9 intra-crystal electric field measurement unit
10 bias electrode
11 bias supply
12 bias supply control unit
13 measurement voltage calculation unit
14 optical fiber
15 bushing
16 insulating support
21a, 21b conductive layer
31 quarter-wavelength plate
32 beam splitter
33 reflected-light detector
34 lock-in amplifier
35 signal attenuator
36 AC power source
37 temperature sensor
38 discharging unit
40 cable head
41a, 41b grounding switch
42 disconnector
43 lightning arrester
44 current transformer
50 bus bar
100 input unit
101 output unit

The invention claimed is:

1. A voltage measuring device comprising:
a light source;
a polarizer to polarize light emitted from the light source;
a grounded conductor provided in such a way as to be separated from a high-voltage conductor, the grounded conductor being grounded;
a crystal end face electrode having a floating potential, the crystal end face electrode being out of contact with the grounded conductor and the high-voltage conductor;
a Pockels cell to transmit the light emitted from the polarizer, the Pockels cell being provided between the crystal end face electrode and the grounded conductor;
an analyzer to transmit the light reflected by the Pockels cell;
a photodetector to detect the light emitted from the analyzer;
an intra-crystal electric field measurer to convert a voltage output by the photodetector into an intra-crystal electric field and output the intra-crystal electric field;
a bias electrode provided between the high-voltage conductor and the crystal end face electrode in such a way as to be out of contact with the crystal end face electrode;
a bias supply connected to the bias electrode;
a bias supply controller to control the bias supply so as to keep an internal electric field of the Pockels cell at zero, the bias supply controller being connected to the intra-crystal electric field measurer; and
a measurement voltage calculator to obtain a voltage of the high-voltage conductor based on results output by the intra-crystal electric field measurer and the bias supply controller.

2. The voltage measuring device according to claim 1, wherein
the Pockels cell includes:
an electro-optical crystal;
a first conductive layer provided on a contact face between the electro-optical crystal and the crystal end face electrode; and
a second conductive layer provided on a contact face between the electro-optical crystal and the grounded conductor in such a way as to face the first conductive layer.

3. The voltage measuring device according to claim 2, wherein
the first conductive layer is formed of a conductive material having an optical reflective property, and
the second conductive layer is formed of a material having an optical transmission property.

4. The voltage measuring device according to claim 1, wherein
a polarization phase difference of the light propagating through the Pockels cell is doubled as a result of reflection of the light in the Pockels cell.

5. The voltage measuring device according to claim 1, comprising
a quarter-wavelength plate provided between the polarizer and the analyzer.

6. The voltage measuring device according to claim 1, comprising:
a beam splitter provided between the analyzer and the Pockels cell; and
a reflected-light detector to detect reflected light output from the beam splitter.

7. The voltage measuring device according to claim 1, comprising:
an AC power source;
a signal attenuator to attenuate a voltage generated by the AC power source to form a signal; and
a lock-in amplifier to perform phase-synchronous detection of an output from the photodetector by using, as a reference signal, the signal attenuated by the signal attenuator, wherein
the grounded conductor is grounded via the AC power source.

8. The voltage measuring device according to claim 2, comprising:
a quarter-wavelength plate provided between the polarizer and the analyzer; and
a temperature sensor provided so as to measure temperatures of the electro-optical crystal, the light source, the polarizer, the analyzer, the photodetector, and the quarter-wavelength plate.

9. The voltage measuring device according to claim 1, comprising:
a discharger to discharge charge of the crystal end face electrode.

10. The voltage measuring device according to claim 1, wherein
the high-voltage conductor is a charger connected to a power transmission line for DC power transmission, and
the grounded conductor has a flat-plate shape.

11. A gas-insulated switching apparatus comprising:
the voltage measuring device according to claim 1, wherein
the high-voltage conductor is a bus bar, and
the grounded conductor is a cylindrical metal conductor surrounding the bus bar.

\* \* \* \* \*